United States Patent
Sohn et al.

(10) Patent No.: US 6,667,200 B2
(45) Date of Patent: Dec. 23, 2003

(54) METHOD FOR FORMING TRANSISTOR OF SEMICONDUCTOR DEVICE

(75) Inventors: Yong Sun Sohn, Kyoungki-do (KR); Chang Woo Ryoo, Kyoungki-do (KR); Jeong Youb Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/331,265

(22) Filed: Dec. 30, 2002

(65) Prior Publication Data

US 2003/0215992 A1 Nov. 20, 2003

(30) Foreign Application Priority Data

May 20, 2002 (KR) ........................................ 2002-27905

(51) Int. Cl.$^7$ .......................................... H01L 21/8238
(52) U.S. Cl. ...................... 438/199; 438/217; 438/222; 438/226; 438/227; 438/231; 438/289
(58) Field of Search .................. 438/197, 199, 438/216, 217, 218, 222, 223, 224, 226, 227, 228, 229, 230, 231, 232, 275, 279, 276, 282, 287, 289, 291, 299, 584, 585, 587, 591

(56) References Cited

FOREIGN PATENT DOCUMENTS

JP    2002-25931    *   1/2002

OTHER PUBLICATIONS

Lee et al., "Laser Thermal Annealed SSR well Prior to Epi–channel Growth (LASPE) for 70 nm nFETs", 2000 IEEE.

Asenov et al., "Suppression of Random Dopant–Induced Threshold Voltage Fluctuations in Sub–0.1–$\mu$m MOSFET"s with Expitaxial and $\delta$–Doped Channels", IEEE Transactions on Electron Devices, vol. 46, No. 8, Aug. 1999.

* cited by examiner

*Primary Examiner*—Jack Chen
(74) *Attorney, Agent, or Firm*—Marshall, Gerstein & Borun LLP (57) ABSTRACT

A method for forming a transistor of a semiconductor device, including the step of forming channel layers of a first and a second conductive types, performing high temperature thermal process to form stabilized channel layers and forming an epitaxial channel structure having a super-steep-retrograde $\delta$-doped layer by growing undoped silicon epitaxial layers, treating the entire surface of the resulting structure with hydrogen, forming an epitaxial channel structure by growing undoped silicon epitaxial layers on the stabilized channel layers, forming gate insulating films and gate electrodes on the epitaxial channel structures, re-oxidizing the gate insulating films for repairing damaged portions of the gate insulating films; and forming a source/drain region and performing a low temperature thermal process.

21 Claims, 9 Drawing Sheets

METHOD FOR FORMING TRANSISTOR OF SEMICONDUCTOR DEVICE

BACKGROUND

1. Technical Field

A method for forming a transistor of a semiconductor device is disclosed and, in particular, an improved method for forming a metal-oxide-semiconductor field effect transistor (MOSFET) or metal-insulator-semiconductor field effect transistor (MISFET) is disclosed which has an ultra-shallow super-steep-retrograde epitaxial channel with a channel length below 100 nm that can be applied to an ultra large scale integrated (ULSI) semiconductor device.

2. Description of the Related Art

A surface region below a gate electrode and a gate insulating film of a MOSFET or MISFET semiconductor device serves as a current path when an electric field is applied to a source/drain region with a voltage applied to a gate. This region is called a channel.

The characteristics of the MOSFET or MISFET semiconductor device are determined by a dopant concentration in the channel region. Specifically, the characteristics of the device such as a threshold voltage of a transistor and a drain current are dependent upon the dopant concentration, and thus the channel region must be precisely doped.

Conventional channel doping methods include well ion implantation, channel ion implantation, threshold voltage ion implantation, and other related techniques.

According to the aforementioned methods, a flat channel having a constant channel region concentration in a depth-wise direction, a buried channel formed in a specific channel depth, and a retrograde channel having a channel concentration which increases in a depthwise direction can be formed.

A channel structure for a high performance microprocessor having a channel length less than 0.2 $\mu$m is a retrograde channel which is formed according to heavy ion implantation using In, As and Sb. Here, a surface dopant concentration Cs is low so that surface mobility is improved. It is thus possible to manufacture a high performance MOSFET having a good current driving characteristics.

A channel depth $W_d$ must be decreased as a channel length is reduced. Accordingly, the retrograde channel having a channel depth of less than 50 nm cannot be formed via only the ion implantation.

An epitaxial channel has been suggested to solve the foregoing problem. However, since loss and diffusion of channel dopants during an epitaxial channel formation and subsequent thermal process are difficult to control, conventional epitaxial channel transistors fail to provide an improved Ion/Ioff characteristics.

The most idealistic channel doping method is to embody a $\delta$-doped epitaxial channel. However, an embodiment of a $\delta$-doped epitaxial channel having a channel depth of less than 30 nm has not been reported to be possible diffusion of dopants in the subsequent process even when a doped epitaxial layer and an undoped epitaxial layer are employed.

A method for preventing diffusion of a $\delta$-doped layer by doping a channel according to ultra-low energy ion implantation and then instantaneously performing laser thermal process thereon has been suggested at IEDM 2000 by, Lee Jungho, Lee Jungyeop et al., in 'Laser Thermal Annealed SSR Well prior to epitaxial channel Growth (LASPE) for 70 nm nFET'. It has been reported that the laser thermal process controls loss and diffusion dopants during selective epitaxial growth (SEG).

However, the laser thermal process, which controls loss and diffusion of dopants to the epitaxial layer, generates partial melting on a silicon substrate under the laser power, resulting in an aggravation of surface roughness of the substrate and a generation of crystal defect, and cannot be applied to a practical method for manufacturing a semiconductor device.

SUMMARY OF THE DISCLOSURE

Accordingly, a method for forming a transistor of a semiconductor device is disclosed which provides high integration density of the semiconductor device by controlling loss of dopants during thermal process and diffusion of dopant during SEG In order to achieve the above-described object of the invention, a method for forming a transistor of a semiconductor device is disclosed which comprises: (a) defining a first and a second regions on a semiconductor substrate using a device isolation pattern; (b) ion-implanting a first conductive type impurity into the first region to form a first channel layer; (c) ion-implanting a second conductive type impurity into the second region, using exposure mask to form a second channel layer; (d) performing high temperature thermal process to stabilize the first and second channel layers; (e) performing a hydrogen treatment process on the structure resulting from step (d); (f) growing undoped silicon epitaxial layers on the first and the second channel layers of the first conductive type and the stabilized channel layer whereby generating a first and a second $\delta$-doped epitaxial channels of a super-steep-retrograde structure; (g) forming a gate insulating film and a gate electrode on the first and the second $\delta$-doped epitaxial channels, respectively; (h) re-oxidizing the gate insulating film to repair damaged portions of the gate insulating film; and (i) forming a source/drain region and performing a low temperature thermal process.

The ion-implanting process into the first region is performed using As ions at an ion implantation energy ranging from 3 to 30 KeV, or P ions at an ion implantation energy ranging from 1 to 15 KeV; the first channel layer is formed at a depth ranging from 10 to 50 nm below the surface of the semiconductor substrate; the ion-implanting process into the second region is performed using B ions at an ion implantation energy ranging from 100 eV to 1.5 KeV; the second channel layer is formed at a depth ranging from 10 to 50 nm below the surface of the semiconductor substrate; the high temperature thermal process is a rapid thermal process performed at a temperature ranging from 900 to 1000° C.; the step of performing a high temperature thermal process is a spike rapid thermal process performed at a temperature ranging from 1000 to 1100° C.; the undoped silicon epitaxial layers has a thickness ranging from 50 to 30 nm; the step of forming a gate insulating film is performed by growing a low temperature thermal oxide film under steam atmosphere at a temperature ranging from 650 to 750° C.; the step of forming a gate insulating film comprises forming a low temperature thermal oxide film and nitriding the low temperature thermal oxide film with plasma treatment to form a low temperature oxide-nitride film; the gate insulating film is a low-temperature high-dielectric film; the step of forming a gate insulating film comprises depositing a low-temperature high-dielectric film at a temperature ranging from 300 to 650° C. and performing a thermal annealing process in a furnace at a temperature ranging from 400 to 700° C.; the step of forming a gate insulating film comprises depositing a low-temperature high-dielectric film at a temperature ranging from 300 to 650° C. and performing a rapid thermal annealing process at a temperature ranging from 600 to 800° C.; the step of forming a gate insulating film comprises growing a low temperature thermal oxide film under steam atmosphere at a temperature ranging from 650 to 700° C.; depositing a high-dielectric material on the low temperature thermal oxide film at a temperature ranging from 300 to 650° C.; and performing a thermal annealing process in a furnace at a temperature ranging from 400 to 700° C.; the step of forming a gate insulating film comprises growing a low temperature thermal oxide film under steam atmosphere at a temperature ranging from 650 to 750° C.; depositing a high-dielectric material on the low temperature thermal oxide film at a temperature ranging from 300 to 650° C.; and performing a rapid thermal annealing process at a temperature ranging from 600 to 800° C.; the step of re-oxidizing gate insulation films is performed by a rapid thermal oxidation process at a temperature ranging from 750 to 950° C.; the step of re-oxidizing gate insulation films is performed by a rapid spike thermal oxidation process at a temperature ranging from 600 to 1100° C.; the step (h) is processed by a thermal oxidation process performed in an oxidation furnace at a temperature ranging from 650 to 800° C.; the low temperature thermal process of step (i) is performed by a rapid thermal annealing process at a temperature ranging from 600 to 1000° C.; the low temperature thermal process of step (i) is performed by a rapid spike thermal annealing process at a temperature ranging from 600 to 1100° C.; the low temperature thermal process of step (i) is performed in a furnace at a temperature ranging from 300 to 750° C.

An ultra-shallow super-steep-retrograde epitaxial channel having a channel depth ranging from 10 to 30 nm is formed by controlling loss of dopants during subsequent hydrogen prebake process prior to SEG and diffusion of dopants during SEG by performing ion implantation for doping channel using a low ion implantation energy, and performing high temperature rapid thermal process at a temperature below a silicon melting point.

BRIEF DESCRIPTION OF THE DRAWINGS

The disclosed methods will become better understood with reference to the accompanying drawings which are given only by way of illustration and thus are not limitative of this disclosure, wherein:

FIGS. 1a to 3 are a cross-sectional diagram and graphs showing data obtained from experiments for explaining a technical principle of a method for forming a transistor of a semiconductor device in accordance with this disclosure;

DETAILED DESCRIPTION OF THE PRESENTLY PREFERRED EMBODIMENTS

Preferred methods for forming a transistor of a semiconductor device will now be described in detail with reference to the accompanying drawings.

Figure 1A:
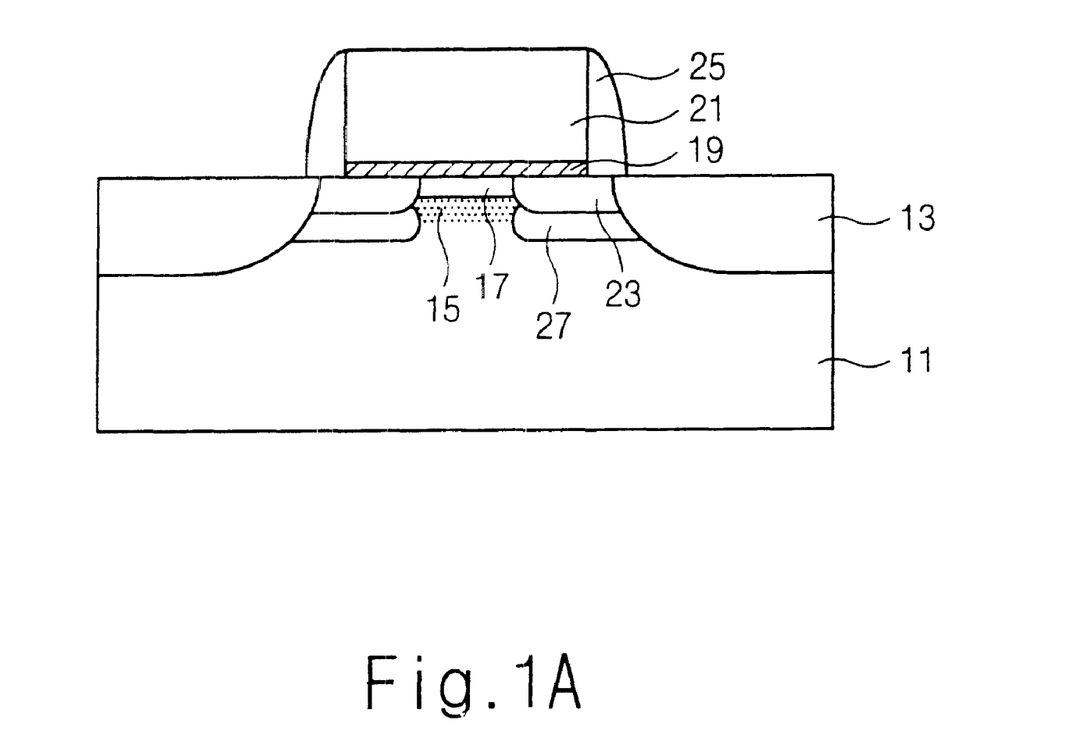

FIG. 1a is a schematic cross-sectional diagram illustrating a transistor having an ultra-shallow super-steep-retrograde (SSR) silicon epitaxial (Si-Epi) channel. Referring to FIG. 1a, the transistor comprises a semiconductor substrate 11, a stacked structure of a gate insulating film 19 and a gate electrode 21 disposed on the semiconductor substrate 11, an insulating film spacer 25 disposed on the sidewalls of the stacked structure, a source/drain region 13 and a source/drain extension region 23 disposed on the semiconductor substrate 11 at both sides of the stacked structure, a punch stop 27 disposed below the source/drain extension region 23, a channel layer 15 disposed between the source/drain extension regions 23, and an epitaxial channel layer 17 disposed on the channel layer 15 under the gate insulating film 19. Here, a channel depth $W_d$ required for the MOSFET or MISFET having a channel length of less than 100 nm must be equal to or less than 30 nm, as discribed in 'Suppression of Random Dopant Induced Threshold Voltage Fluctuations in Sub-0.1 $\mu$m MOSFETs with epitaxial and $\delta$-doped Channels', IEEE Transactions on Electron Devices, Vol 46, No 8, 1999 by Asen Asenov and Subhash Saini.

Figure 1B:
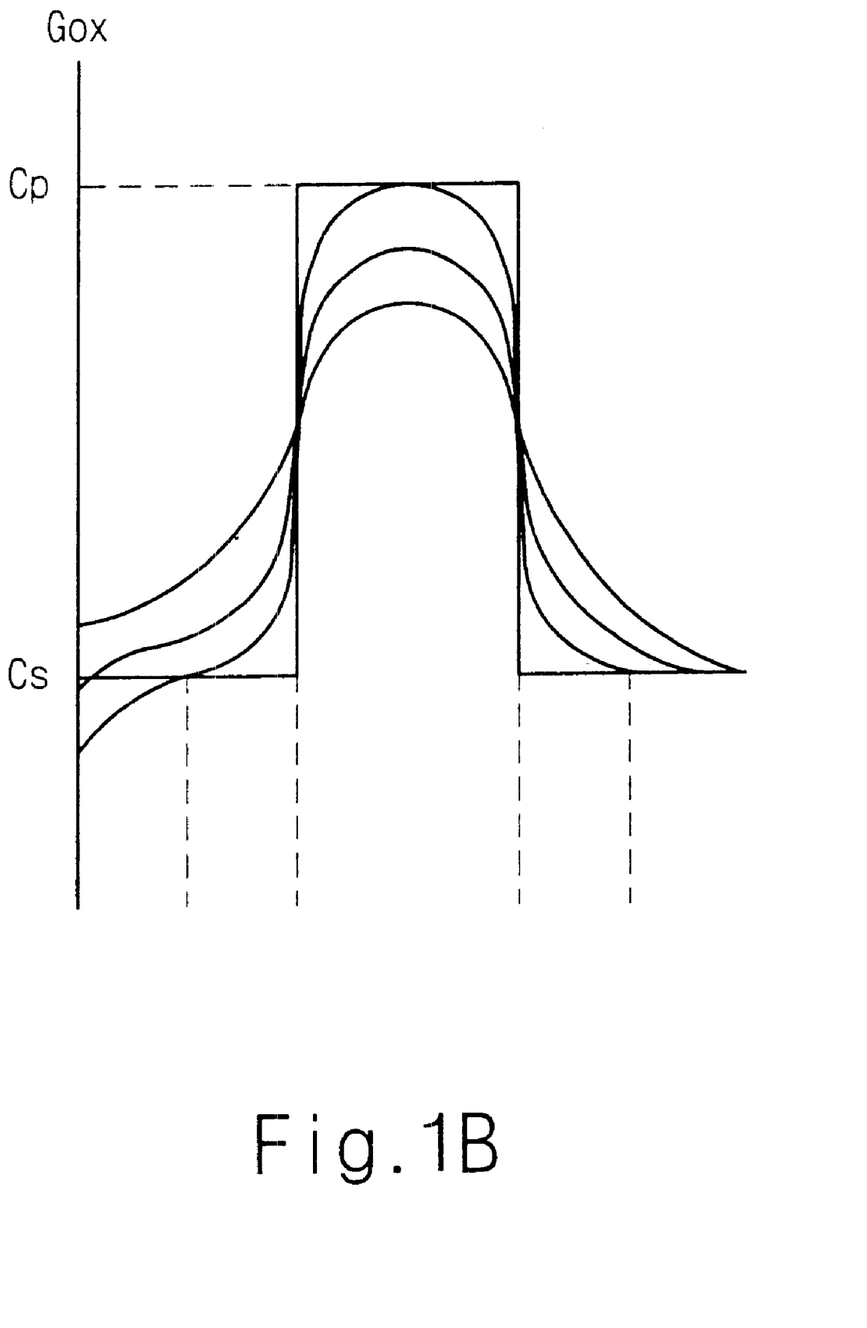

FIG. 1b is a diagram illustrating broadening of an ideal $\delta$ doping profile due to rapid transient enhanced diffusion (TED) generated by crystal defects and thermal diffusion due to subsequent thermal treatment. As can be seen from FIG. 1b, a method for controlling the TED and thermal diffusion is necessary for the formation of the SSR channels. Here, Cs denotes a surface concentration, Cp denotes a peak concentration, and Gox denotes a gate oxide film.

Figure 2A:
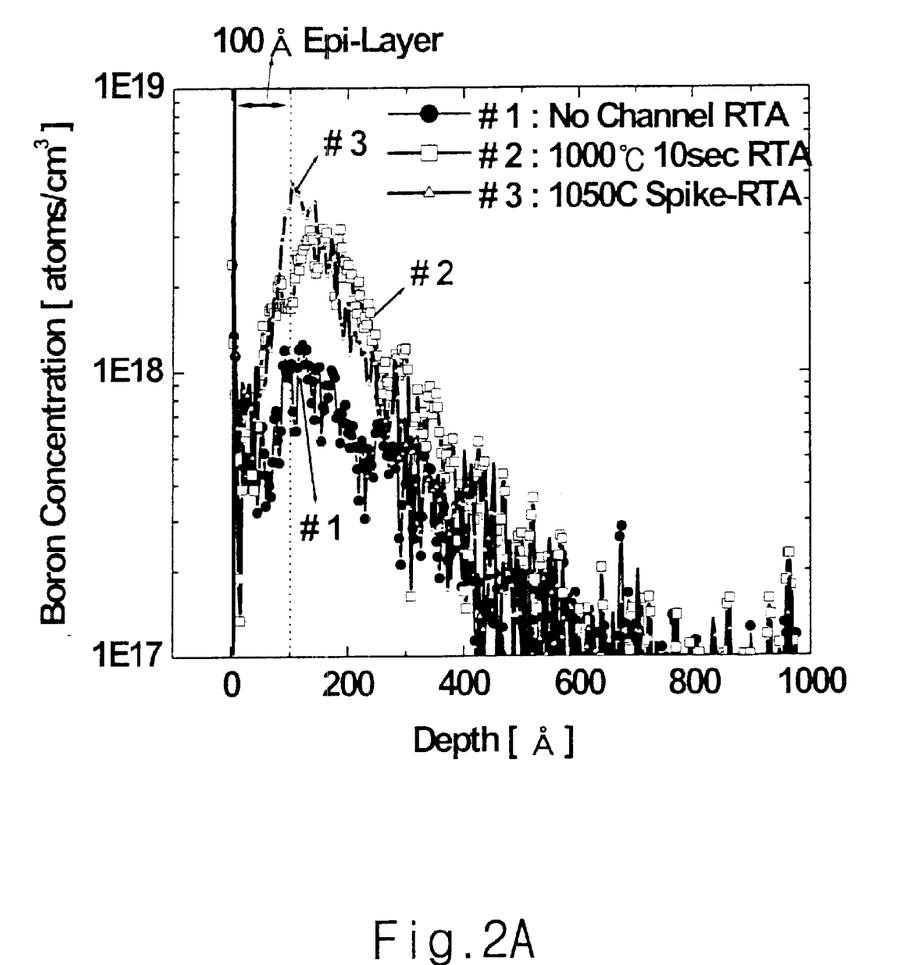

FIG. 2a is a graph showing the doping profile of the ultra-shallow SSR epitaxial channel having a channel depth of 10 nm in accordance with the present invention. As shown in FIG. 2a, the loss of dopants and re-distribution are reduced after the SEG as a temperature of the rapid thermal treatment after a channel ion implantation increases. It should be noted that a desired retrograde doping profile is not obtained due to serious loss of dopants when the high temperature channel thermal treatment is not performed.

Figure 2B:
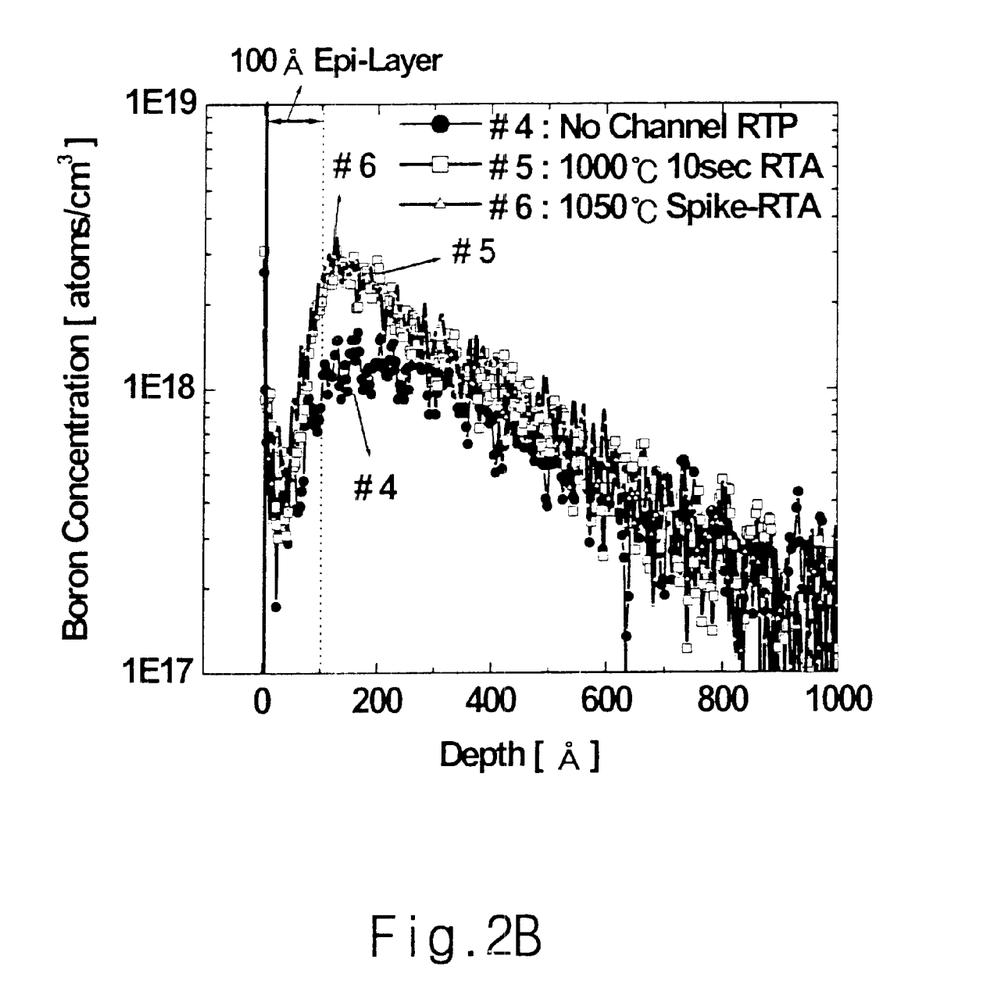

FIGS. 2a and 2b are graphs respectively illustrating SSR channel doping profile variations under RTA conditions after ion-implanting $10^{13}$ ion/cm$^2$ of B ions with channel ion implantation energies of 1 KeV and 5 KeV and performing the channel RTA thereon directly after the epitaxial growth.

As shown in FIGS. 2a and 2b, the lower the channel ion implantation energy is, the narrower the distribution range of the doping layer is. Here, the $\delta$ doping having a narrower distribution range reduces junction capacitance and junction leakage current of the device, resulting in low power high efficiency semiconductor device.

Figure 3:
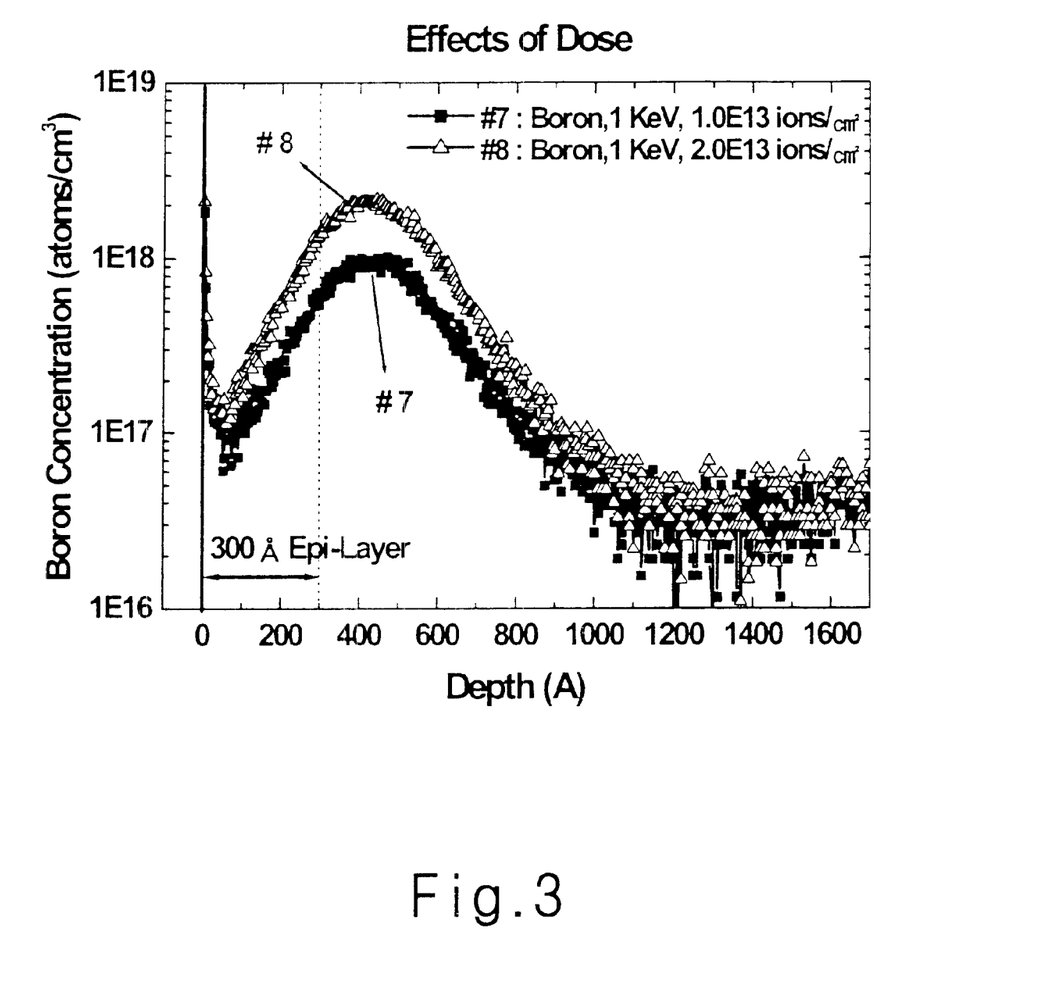

FIG. 3 is a secondary ion mass spectrometry experiment data. As shown in FIG. 3, the SSR doping profile is maintained even when the ultra-shallow epitaxial channel having a channel depth of 30 nm in accordance with the present invention is influenced by dopant diffusion due to subsequent processes such as selective gate re-oxidation and thermal treatment for a source/drain after the low temperature gate oxidation and gate patterning processes. It should be noted that the SSR $\delta$-doped epitaxial channel required for 100 nm n-MOSFET can be formed in accordance with the method of the present invention as can be seen from FIG. 3.

FIGS. 4a to 4f are cross-sectional diagrams illustrating sequential steps of a method for forming a transistor of a semiconductor device in accordance with a first embodiment, where a CMISFET is shown as an example.

Figure 4A:
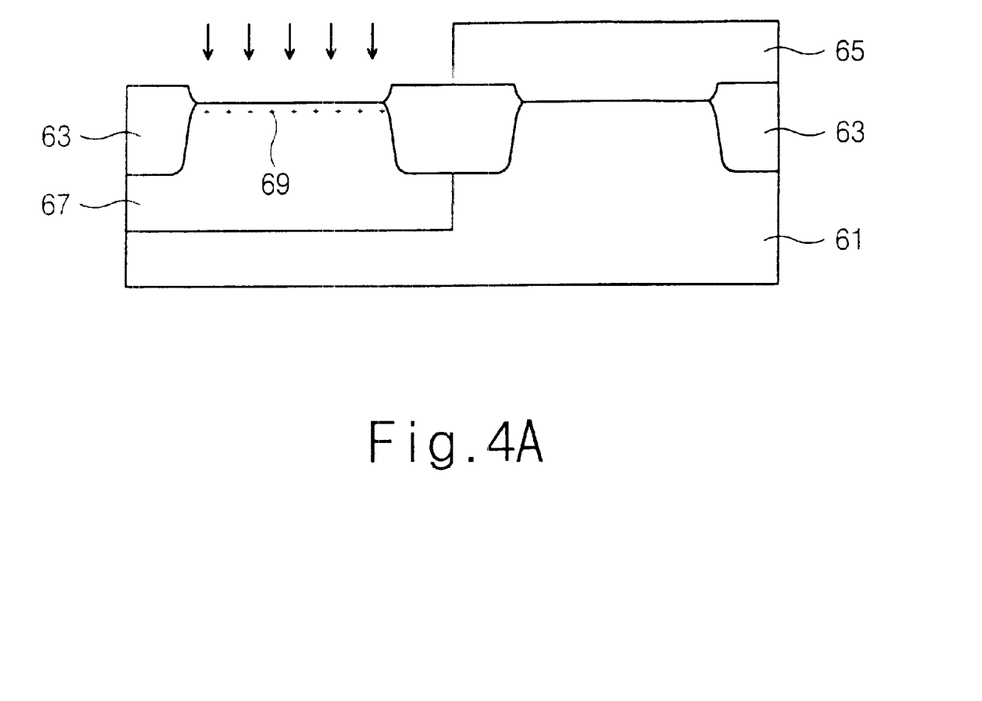
FIGS. 4a to 4f are cross-sectional diagrams illustrating sequential steps of a method for forming a transistor of a semiconductor device in accordance with a first embodiment.

Referring to FIG. 4a, a device isolation film 63 defining an active region on a semiconductor substrate 61 is formed. Preferably, the device isolation film 63 is a trench type.

Thereafter, a first photosensitive film pattern 65 is formed on the semiconductor substrate 61. The first photosensitive film pattern 65 is formed according to exposure and development processes using an exposure mask exposing pMISFET region of the CMISFET, namely an n-well exposure mask.

An n-well 67 is formed by ion-implanting an n-type impurity into the semiconductor substrate 61 using the first photosensitive film pattern 65 as a mask, and an n-well field-sensitive ion implantation is then performed thereon.

An n-type channel layer 69 is formed at a depth ranging from 10 to 50 nm below the surface of the semiconductor substrate 61 by implanting n-type ions for a p-channel such as P or As into the semiconductor substrate 61 of the n-well 67 using the first photosensitive film pattern 65 as a mask with an ion implantation energy ranging from 1 to 15 KeV or from 3 to 30 KeV.

Figure 4B:
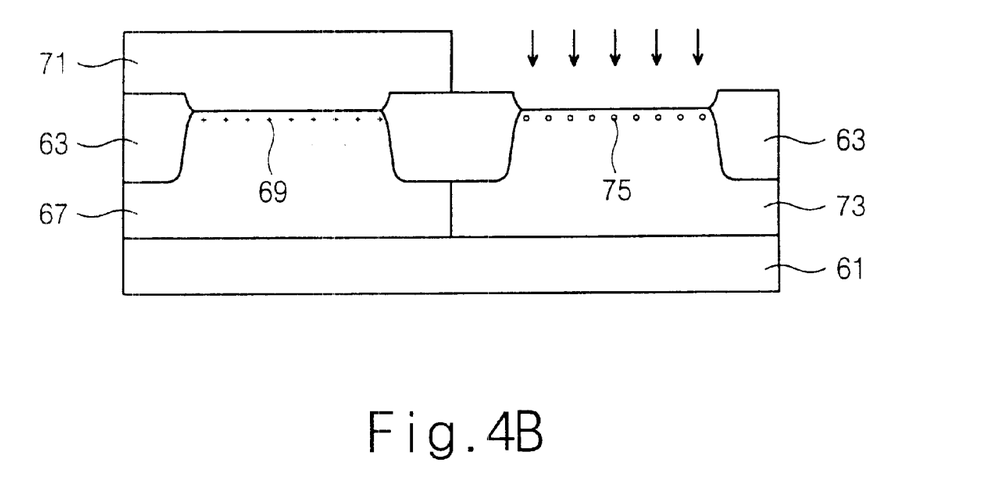

Referring to FIG. 4b, the first photosensitive film pattern 65 is removed, and a second photosensitive film pattern 71 is formed on the semiconductor substrate 61. The second photosensitive film pattern 71 is formed according to exposure and development processes using an exposure mask exposing nMISFET region of the CMISFET, namely a p-well exposure mask.

A p-well 73 is formed by ion-implanting a p-type impurity into the semiconductor substrate 61 using the second photosensitive film pattern 71 as a mask, and a p-well field-stop ion implantation is then performed thereon.

A p-type channel layer 75 is formed at a depth of 10 to 50 nm from the surface of the semiconductor substrate 61 very thin by implanting p-type ions for an n-channel such as B into the semiconductor substrate 61 of the p-well 73 using the second photosensitive film pattern 71 as a mask with a low ion implantation energy ranging from 100 eV to 1.5 KeV.

Figure 4C:
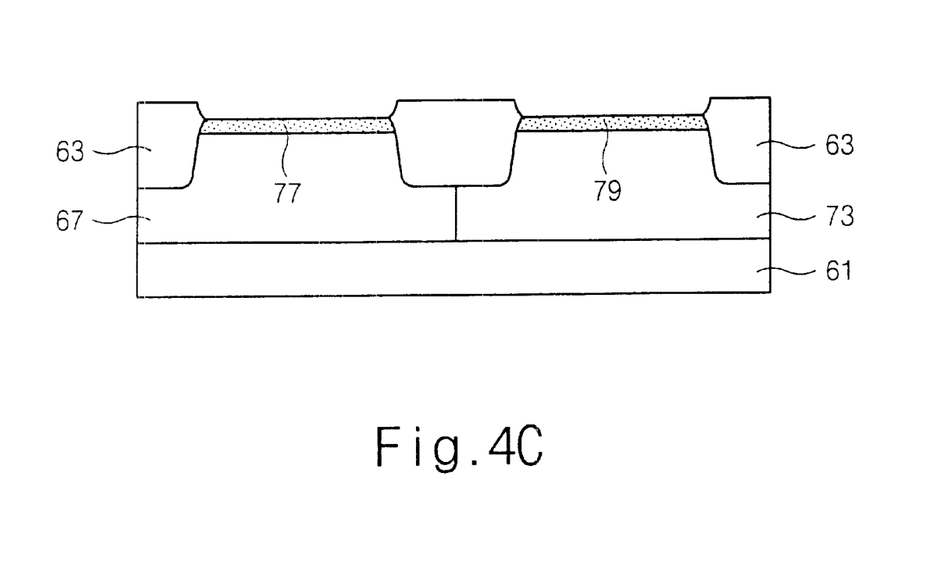

Referring to FIG. 4c, the second photosensitive film pattern 71 is then removed. High temperature rapid thermal process (RTA) or high temperature spike rapid thermal process (SRTA) is performed to remove damages of the semiconductor substrate 61 resulted from the ion implantation for forming the n-type and p-type channel layers 69 and 75 to form a stabilized n-type channel layer 77 and a stabilized p-type channel layer 79 in the pMISFET and NMISFET regions, respectively.

Here, the RTA and the SRTA remove crystal defects and enable the implanted dopant ions to stably combine with adjacent silicon atoms in crystals in order to maximize the control of diffusion of dopants, during the subsequent SEG and the subsequent thermal process.

Here, the RTA is preferably performed at a temperature ranging from 900 to 1000° C., and the SRTA is performed at a high temperature ranging from 1000 to 1100° C.

Figure 4D:
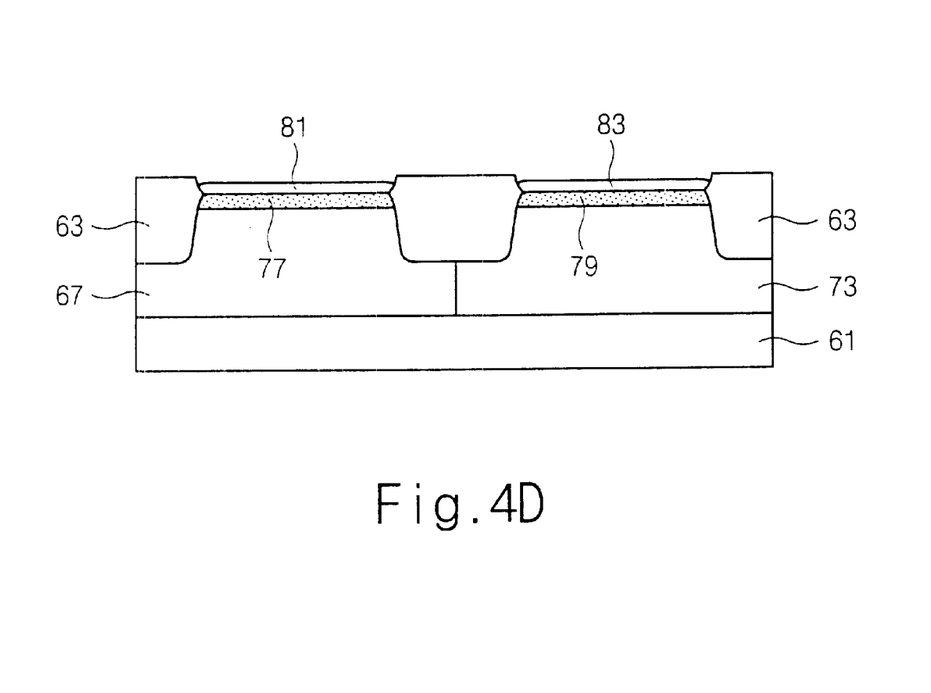

Referring to FIG. 4d, a surface treatment using hydrogen is carried out to remove a natural oxide film (not shown) on the upper portion of the semiconductor substrate 61 where the stabilized n-type channel layer 77 and the stabilized p-type channel layer 79 are formed. Thereafter, undoped Si-Epi layers each having a thickness ranging from 5 to 30 nm are grown according to the SEG on the stabilized n-type channel layer 77 and the stabilized p-type channel layer 79, respectively, which minimize the loss and re-distribution of dopants. This completes the formation of the epitaxial channel structure having the SSR δ-doped layer composed of a low concentration n-type epitaxial layer 81 and the n-type channel layer 77, and a low concentration p-type epitaxial layer 83 and the p-type channel layer 79 in the pMISFET and nMISFET regions, respectively.

Preferably, the n-type and the p-type epitaxial layers 81 and 83 have a thickness ranging from 5 to 30 nm and are automatically doped to have a low concentrations by the channel layers thereunder.

Figure 4E:
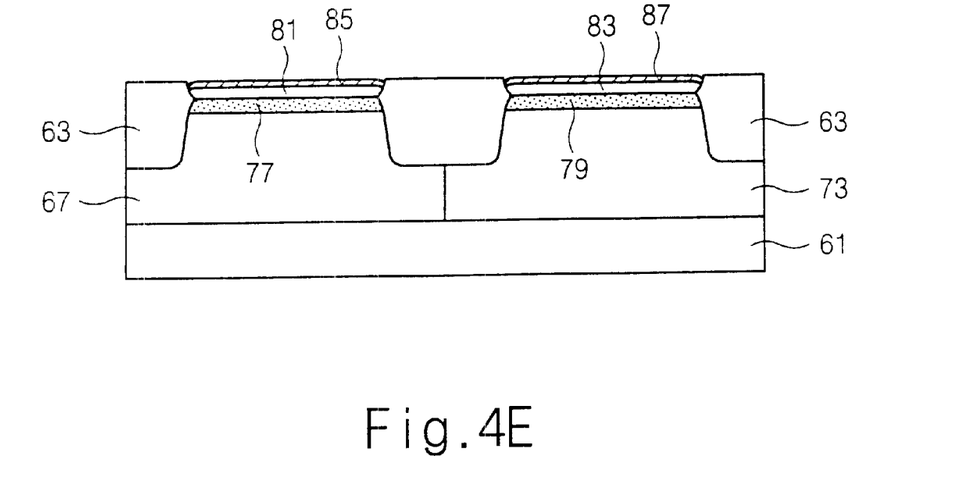

As illustrated in FIG. 4e, gate insulating films 85 and 87 are formed on the semiconductor substrate in of the pMISFET and NMISFET regions, respectively.

Here, the gate insulating films 85 and 87 are preferably formed by one of following methods to minimize diffusion of dopants in the n-type and p-type channel layers 77 and 79 to maintain the doping profile of the SSR δ-doped layer:

(a) The gate insulating film may be formed by growing a low temperature thermal oxide film under a steam atmosphere having a temperature ranging from 650 to 750° C.;

(b) The gate insulating film may be a low temperature nitrided oxide film formed by nitriding the low temperature thermal oxide film of a plasma treatment;

(c) The gate insulating film may be a dielectric film having a high dielectric constant formed according to low temperature deposition at a temperature ranging from 300 to 650° C. and then subjecting the dielectric film to a thermal annealing process in a furnace having a temperature ranging from 400 to 700° C., or may be formed according to a low temperature deposition at a temperature ranging from 300 to 650° C. and the subjecting to a rapid thermal annealing process at a temperature ranging from 600 to 800° C.; and (d) The gate insulating film may be a stacked structure of a low temperature thermal oxide film of (a) and a low temperature dielectric film of (c) subjected to a thermal process in a furnace. In addition, the gate insulating film may be a stacked structure of a low temperature thermal oxide film of (a) subjected to a low temperature dielectric film of (c) and a rapid thermal process.

Figure 4F:
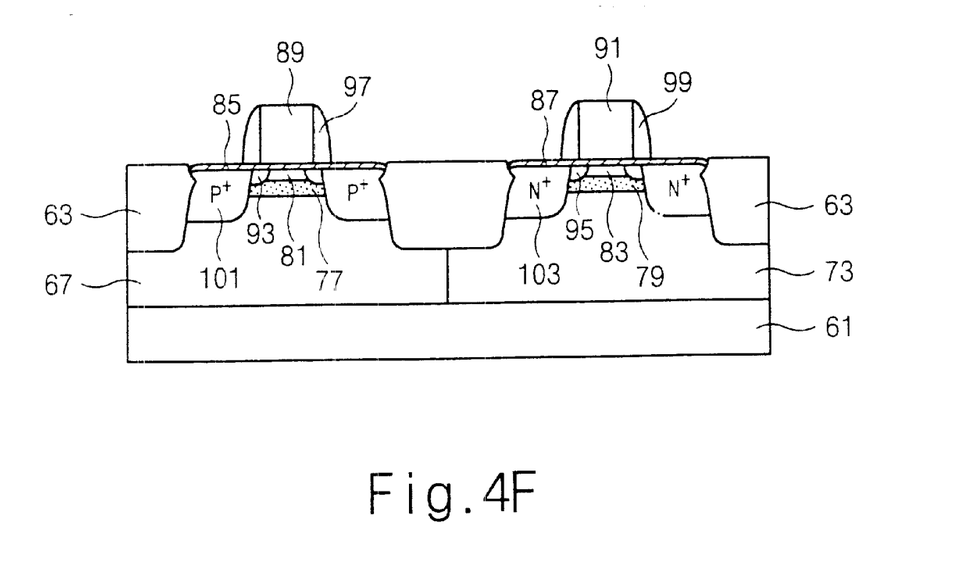

Referring to FIG. 4f, gate electrodes 89 and 91 are formed on the gate insulating films 85 and 87 by patterning, and the re-oxidation of the gate insulating films 89 and 91 is then performed.

The re-oxidation of the gate insulating films are preferably performed by one of following methods:

(a) Rapid thermal oxidation (RTO) at a temperature ranging from 750 to 950° C.;

(b) Rapid spike thermal oxidation at a temperature ranging from 600 to 1100° C.; and (c) Thermal oxidation in an oxidation furnace having a temperature ranging from 650 to 800° C.

Thereafter, p-type and n-type source/drain extension (SDE) regions 93 and 95 are formed by ion-implanting p-type and n-type impurities into the pMISFET and nMISFET regions using separate exposure masks, respectively.

Insulating film spacers 97 and 99 are then formed on the sidewalls of the gate electrodes 89 and 91. Source/drain regions 101 and 103 which are high concentration p-type and n-type impurity regions are then formed by ion-implanting high concentration p-type and n-type impurities into the pMISFET and nMISFET regions using separate exposure masks, respectively, and subsequent thermal annealing process is subsequently performed to complete the formation the CMISFET.

Here, the channel layers 77 and 79 of the CMISFET serves as punch stop doping layers for preventing short channel effects.

The subsequent thermal annealing process may be a rapid thermal annealing process, a rapid spike thermal annealing process, or a thermal annealing process performed in a furnace.

When the subsequent thermal annealing process is a rapid thermal annealing process, it is preferable that RTA process is performed at a temperature ranging from 600 to 1000° C. When the subsequent thermal annealing process is a rapid spike thermal annealing process, it is preferable that the rapid spike thermal annealing process is performed at a temperature ranging from 600 to 1100° C. When the subsequent thermal annealing process is a thermal annealing process performed in a furnace, it is preferable that the thermal annealing process is performed at a temperature ranging from 300 to 750° C.

Figure 5:
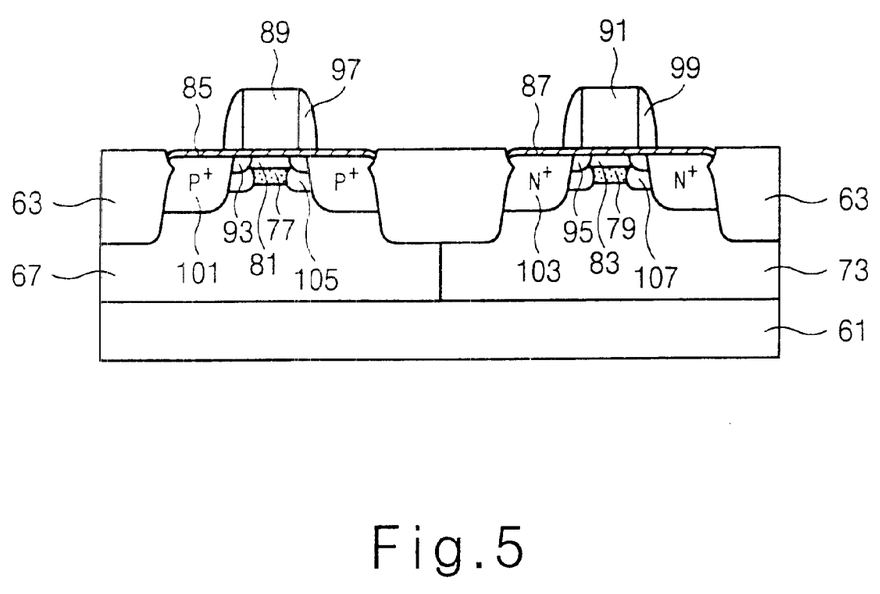
FIG. 5 is a cross-sectional diagram illustrating a method for forming a transistor of a semiconductor device in accordance with a second embodiment.

FIG. 5 is a cross-sectional diagram illustrating a method for forming a transistor of a semiconductor device in accordance with a second disclosed embodiment, wherein CMOSFET is shown.

As shown in FIG. 5, the CMOSFET further includes halo regions 105 and 107 formed by tilt implanting n-type and p-type halo impurities, namely impurities having the same conductive type the well into the portions under the p-type and n-type SDE regions 93 and 95 of FIG. 4f, respectively.

Here, the halo regions 105 and 107 serve to control the short channel effects of the transistor and improve the electrical characteristics of the device.

As discussed earlier, the disclosed methods for forming a transistor of a semiconductor device have the following advantages:

(a) The loss and re-distribution of the channel dopants in the formation of the epitaxial channel structure is controlled by recovering lattice damages due to ion implantation in the channel region, thereby enabling the formation of the ultra-shallow SSR channel structure. Thus, the random dopant induced Vt variations generated by non-uniform dopant distributions in the device having a channel length less than 100 nm, and the short channel effects caused by a gate having a length less than 100 nm are controlled, to improve yield of the device having a channel length less than 100 nm.

(b) The dopant concentration at the surface of the channel region is reduced to 1/10 of the maximum concentration of the channel layer, thereby improving the surface mobility and current driving characteristics.

(c) The ultra-shallow SSR channel structure in accordance with the present invention may be applied to a process for manufacturing a low voltage, low power devices having a low threshold voltage.

As the disclosed techniques may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for forming a transistor of a semiconductor device, the method comprising the steps of:
   (a) defining a first and a second regions on a semiconductor substrate using a device isolation film pattern;
   (b) ion-implanting a first conductive type impurity into the first region to form a first channel layer;
   (c) ion-implanting a second conductive type impurity into the second region, using an exposure mask to form a second channel layer;
   (d) performing a high temperature thermal process to convert the first and second channel layers into first and second stabilized channel layers, respectively;
   (e) performing a hydrogen treatment process on the structure resulting from step (d);
   (f) growing undoped silicon epitaxial layers on the first and the second stabilized channel layers thereby generating a first and a second δ-doped epitaxial channels of a super-steep-retrograde structure;
   (g) forming a gate insulating film and a gate electrode on the first and the second δ-doped epitaxial channels, respectively;
   (h) re-oxidizing the gate insulating film to repair damaged portions of the gate insulating film; and
   (i) forming a source/drain region and performing a low temperature thermal process.

2. The method according to claim 1, wherein the ion-implanting process into the first region is performed using As ions at an ion implantation energy ranging from 3 to 30 KeV, or P ions at an ion implantation energy ranging from 1 to 15 KeV.

3. The method according to claim 1, wherein the first channel layer is formed at a depth ranging from 10 to 50 nm below the surface of the semiconductor substrate.

4. The method according to claim 1, wherein the ion-implanting process into the second region is performed using B ions at an ion implantation energy ranging from 100 eV to 1.5 KeV.

5. The method according to claim 1, wherein the second channel layer is formed at a depth ranging from 10 to 50 nm below the surface of the semiconductor substrate.

6. The method according to claim 1, wherein the high temperature thermal process is a rapid thermal process performed at a temperature ranging from 900 to 1000° C.

7. The method according to claim 1, wherein the step of performing a high temperature thermal process is a spike rapid thermal process performed at a temperature ranging from 1000 to 1100° C.

8. The method according to claim 1, wherein the undoped silicon epitaxial layers has a thickness ranging from 50 to 30 nm.

9. The method according to claim 1, wherein the step of forming a gate insulating film is performed by growing a low temperature thermal oxide film under a steam atmosphere at a temperature ranging from 650 to 750° C.

10. The method according to claim 1, wherein the step of forming a gate insulating film comprises forming a low temperature thermal oxide film and nitriding the low temperature thermal oxide film with plasma treatment to form a low temperature oxide-nitride film.

11. The method according to claim 1, wherein the gate insulating film is a low-temperature high-dielectric film.

12. The method according to claim 11, wherein the step of forming a gate insulating film comprises depositing a low-temperature high-dielectric film at a temperature ranging from 300 to 650° C. and performing a thermal annealing process in a furnace at a temperature ranging from 400 to 700° C.

13. The method according to claim 11, wherein the step of forming a gate insulating film comprises depositing a low-temperature high-dielectric film at a temperature ranging from 300 to 650° C. and performing a rapid thermal annealing process at a temperature ranging from 600 to 800° C.

14. The method according to claim 1, wherein the step of forming a gate insulating film comprises:
   growing a low temperature thermal oxide film under a steam atmosphere and at a temperature ranging from 650 to 700° C.;
   depositing a high-dielectric material on the low temperature thermal oxide film at a temperature ranging from 300 to 650° C.; and performing a thermal annealing process in a furnace at a temperature ranging from 400 to 700° C.

15. The method according to claim 1, wherein the step of forming a gate insulating film comprises:

growing a low temperature thermal oxide film under a steam atmosphere and at a temperature ranging from 650 to 750° C.;

depositing a high-dielectric material on the low temperature thermal oxide film at a temperature ranging from 300 to 650° C.; and performing a rapid thermal annealing process at a temperature ranging from 600 to 800° C.

16. The method according to claim 1, wherein the step of re-oxidizing gate insulating film is performed by a rapid thermal oxidation process at a temperature ranging from 750 to 950° C.

17. The method according to claim 1, wherein the step of re-oxidizing gate insulating film is performed by a rapid spike thermal oxidation process at a temperature ranging from 600 to 1100° C.

18. The method according to claim 1, wherein the step (h) is processed by a thermal oxidation process performed in an oxidation furnace at a temperature ranging from 650 to 800° C.

19. The method according to claim 1, wherein the low temperature thermal process of step (i) is performed by a rapid thermal annealing process at a temperature ranging from 600 to 1000° C.

20. The method according to claim 1, wherein the low temperature thermal process of step (i) is performed by a rapid spike thermal annealing process at a temperature ranging from 600 to 1100° C.

21. The method according to claim 1, wherein the low temperature thermal process of step (i) is performed in a furnace at a temperature ranging from 300 to 750° C.

* * * * *